(12) United States Patent
Sheperek et al.

(10) Patent No.: US 11,416,173 B2
(45) Date of Patent: *Aug. 16, 2022

(54) MEMORY SYSTEM WITH DYNAMIC CALIBRATION USING A VARIABLE ADJUSTMENT MECHANISM

(71) Applicant: Micron Technology, Inc., Boise, ID (US)

(72) Inventors: Michael Sheperek, Longmont, CO (US); Larry J. Koudele, Erie, CO (US); Steve Kientz, Westminster, CO (US)

(73) Assignee: Micron Technology, Inc., Boise, ID (US)

( * ) Notice: Subject to any disclaimer, the term of this patent is extended or adjusted under 35 U.S.C. 154(b) by 49 days.

This patent is subject to a terminal disclaimer.

(21) Appl. No.: 16/850,224

(22) Filed: Apr. 16, 2020

(65) Prior Publication Data
US 2020/0241801 A1     Jul. 30, 2020

Related U.S. Application Data

(63) Continuation of application No. 15/981,796, filed on May 16, 2018, now Pat. No. 10,664,194.

(51) Int. Cl.
| | | |
|---|---|---|
| *G06F 3/00* | (2006.01) | |
| *G06F 3/06* | (2006.01) | |
| *G11C 16/26* | (2006.01) | |
| *G11C 16/04* | (2006.01) | |

(52) U.S. Cl.
CPC .......... *G06F 3/0659* (2013.01); *G06F 3/0604* (2013.01); *G06F 3/0679* (2013.01); *G11C 16/26* (2013.01); *G11C 16/0483* (2013.01)

(58) Field of Classification Search
None
See application file for complete search history.

(56) References Cited

U.S. PATENT DOCUMENTS

| | | |
|---|---|---|
| 9,153,336 B1 | 10/2015 | Yang et al. |
| 9,454,420 B1 | 9/2016 | Tai et al. |
| 9,472,298 B1 | 10/2016 | Louie et al. |
| 9,558,850 B1 | 1/2017 | Bialas et al. |
| 9,761,308 B1 | 9/2017 | Cometti |

(Continued)

FOREIGN PATENT DOCUMENTS

GB         2537484 A     10/2016

OTHER PUBLICATIONS

International Application No. PCT/US2018/033873—International Search Report & Written Opinion, dated Sep. 7, 2018, 9 pages.

(Continued)

*Primary Examiner* — Midys Rojas
(74) *Attorney, Agent, or Firm* — Perkins Coie LLP

(57) ABSTRACT

A memory device includes a processing device configured to iteratively update a center read level according to a first step size after reading a subset of memory cells according to a set of read levels including the center read level; track an update direction for the processing device to use when iteratively updating the center read level, wherein the update direction corresponds to an increase or a decrease in the center read level; detect a change condition based on updating the center read level according to the first step size; and iteratively update the center read level according to a second step size based on detection of the change condition.

20 Claims, 5 Drawing Sheets

(56) References Cited

U.S. PATENT DOCUMENTS

| | | |
|---|---|---|
| 10,140,040 B1 | 11/2018 | Koudele et al. |
| 10,170,195 B1 | 1/2019 | Ioannou et al. |
| 10,379,739 B1 | 8/2019 | Bazarsky et al. |
| 10,388,376 B2 | 8/2019 | Molas et al. |
| 10,452,480 B2 | 10/2019 | Koudele et al. |
| 10,521,140 B2 | 12/2019 | Koudele et al. |
| 10,566,063 B2 | 2/2020 | Sheperek et al. |
| 10,877,827 B2 | 12/2020 | Miladinovic |
| 10,936,205 B2 | 3/2021 | Papandreou et al. |
| 10,963,327 B2 | 3/2021 | Camp et al. |
| 11,176,036 B2 | 11/2021 | Camp et al. |
| 2002/0152459 A1 | 10/2002 | Bates et al. |
| 2005/0201148 A1 | 9/2005 | Chen et al. |
| 2007/0234144 A1 | 10/2007 | Gongwer et al. |
| 2009/0055680 A1 | 2/2009 | Honda et al. |
| 2009/0310404 A1 | 12/2009 | Cho et al. |
| 2010/0073069 A1 | 3/2010 | Wang et al. |
| 2010/0097857 A1 | 4/2010 | Cernea |
| 2010/0188919 A1 | 7/2010 | Fox et al. |
| 2011/0013460 A1 | 1/2011 | Dong et al. |
| 2011/0167307 A1 | 7/2011 | Mori |
| 2011/0305090 A1 | 12/2011 | Roohparvar et al. |
| 2012/0213001 A1 | 8/2012 | Yang |
| 2012/0236641 A1 | 9/2012 | Hu |
| 2012/0236653 A1 | 9/2012 | Spessot et al. |
| 2012/0254699 A1 | 10/2012 | Ruby et al. |
| 2013/0007543 A1 | 1/2013 | Goss et al. |
| 2013/0024743 A1 | 1/2013 | Sharon et al. |
| 2013/0117635 A1 | 5/2013 | Ok et al. |
| 2013/0132652 A1 | 5/2013 | Wood et al. |
| 2013/0227200 A1 | 8/2013 | Cometti et al. |
| 2014/0068365 A1 | 3/2014 | Chen et al. |
| 2014/0119124 A1 | 5/2014 | Kim et al. |
| 2014/0136928 A1 | 5/2014 | Mu et al. |
| 2014/0281661 A1 | 9/2014 | Milton et al. |
| 2014/0281767 A1 | 9/2014 | Alhussien et al. |
| 2014/0380123 A1 | 12/2014 | Liikanen et al. |
| 2015/0036432 A1 | 2/2015 | Huang |
| 2015/0085573 A1 | 3/2015 | Sharon et al. |
| 2015/0309858 A1 | 10/2015 | Weilemann et al. |
| 2015/0378415 A1 | 12/2015 | George |
| 2016/0041891 A1 | 2/2016 | Malshe et al. |
| 2016/0092496 A1 | 3/2016 | Dietterich et al. |
| 2016/0099049 A1 | 4/2016 | Lee et al. |
| 2016/0099078 A1 | 4/2016 | Luo et al. |
| 2016/0117216 A1 | 4/2016 | Muchherla et al. |
| 2016/0132256 A1 | 5/2016 | Jung |
| 2016/0133334 A1 | 5/2016 | Zhang et al. |
| 2016/0147582 A1 | 5/2016 | Karakulak et al. |
| 2016/0148701 A1 | 5/2016 | Karakulak et al. |
| 2016/0148702 A1 | 5/2016 | Karakulak et al. |
| 2016/0179406 A1 | 6/2016 | Gorobets et al. |
| 2016/0218740 A1 | 7/2016 | Parthasarathy et al. |
| 2016/0259693 A1 | 9/2016 | Sundararaman et al. |
| 2016/0266792 A1 | 9/2016 | Amaki et al. |
| 2017/0053714 A1 | 2/2017 | Guy et al. |
| 2017/0091039 A1 | 3/2017 | Hong |
| 2017/0097868 A1 | 4/2017 | Kim et al. |
| 2017/0148510 A1 | 5/2017 | Bazarsky et al. |
| 2017/0148525 A1 | 5/2017 | Kathawala et al. |
| 2017/0241843 A1 | 8/2017 | Jeon et al. |
| 2017/0263311 A1 | 9/2017 | Cometti |
| 2017/0269991 A1 | 9/2017 | Bazarsky et al. |
| 2017/0271031 A1 | 9/2017 | Sharon et al. |
| 2018/0189125 A1 | 7/2018 | Karlik et al. |
| 2018/0277228 A1 | 9/2018 | Takada et al. |
| 2018/0341416 A1 | 11/2018 | Koudele et al. |
| 2018/0341552 A1 | 11/2018 | Liikanen et al. |
| 2018/0341553 A1 | 11/2018 | Koudele et al. |
| 2018/0374550 A1 | 12/2018 | Barndt et al. |
| 2019/0043588 A1 | 2/2019 | Fisher et al. |
| 2019/0066802 A1 | 2/2019 | Malshe et al. |
| 2019/0103164 A1 | 4/2019 | Malshe et al. |
| 2019/0147964 A1 | 5/2019 | Yun et al. |
| 2019/0164599 A1 | 5/2019 | Avraham et al. |
| 2019/0171381 A1 | 6/2019 | Ioannou et al. |
| 2019/0172542 A1 | 6/2019 | Miladinovic |
| 2019/0278653 A1 | 9/2019 | Padilla et al. |
| 2019/0354312 A1 | 11/2019 | Chew et al. |
| 2019/0354313 A1 | 11/2019 | Sheperek et al. |
| 2019/0391865 A1 | 12/2019 | Cadloni et al. |
| 2020/0004440 A1 | 1/2020 | Koudele et al. |
| 2020/0004632 A1 | 1/2020 | Koudele et al. |
| 2020/0168282 A1 | 5/2020 | Sheperek et al. |
| 2020/0411117 A1 | 12/2020 | Malshe et al. |
| 2021/0012857 A1 | 1/2021 | Xie et al. |
| 2021/0027846 A1 | 1/2021 | Malshe et al. |
| 2021/0191638 A1 | 6/2021 | Miladinovic et al. |
| 2021/0200613 A1 | 7/2021 | Cadloni et al. |

OTHER PUBLICATIONS

International Application No. PCT/US2018/033877—International Search Report & Written Opinion, dated Sep. 14, 2018, 22 pages.
International Application No. PCT/US2018/033881—International Search Report & Written Opinion, dated Sep. 14, 2018, 12 pages.
International Application No. PCT/US2019/033179—International Search Report and Written Opinion, dated Sep. 18, 2019, 12 pages.
TW Patent Application No. 107117756—Taiwanese Office Action and Search Report, dated Jan. 31, 2019, 19 pages.
TW Patent Application No. 107117756—Taiwanese Search Report, dated Jul. 22, 2019, with English Translation, 2 pages.
TW Patent Application No. 107117813—Taiwanese Office Action and Search Report, dated Mar. 18, 2019, 17 pages.
EP Patent Application No. 18805869.7—Extended European Search Report, dated Jan. 22, 2021, 8 pages.
EP Patent Application No. 18806016.4—Extended European Search Report, dated Mar. 5, 2021, 12 pages.
EP Patent Application No. 18806327.5—Partial Supplementary European Search Report, dated Jan. 29, 2021, 16 pages.
KR Patent Application No. 10-2019-7037973—Korean Office Action and Search Report, dated Dec. 7, 2020, with English Translation, 13 pages.
EP Patent Application No. 19821879.4—Extended European Search Report, dated Feb. 1, 2022, 9 pages.

ically and continuously calibrating processing levels, in accordance with an embodiment of the present disclosure.
MEMORY SYSTEM WITH DYNAMIC CALIBRATION USING A VARIABLE ADJUSTMENT MECHANISM

CROSS-REFERENCE TO RELATED APPLICATIONS

This application is a continuation of U.S. application Ser. No. 15/981,796, filed May 16, 2018, which is incorporated herein by reference in its entirety.

This application contains subject matter related to a previously-filed U.S. patent application by Larry J. Koudele and Bruce A. Liikanen titled "MEMORY DEVICE WITH DYNAMIC PROCESSING LEVEL CALIBRATION." The related application is assigned to Micron Technology, Inc., and is identified by application Ser. No. 15/605,858, which was filed on May 25, 2017. The subject matter thereof is incorporated herein by reference thereto.

This application contains subject matter related to a previously-filed U.S. patent application by Larry J. Koudele and Bruce A. Liikanen titled "MEMORY DEVICE WITH DYNAMIC TARGET CALIBRATION." The related application is assigned to Micron Technology, Inc., and is identified by application Ser. No. 15/605,855, which was filed on May 25, 2017. The subject matter thereof is incorporated herein by reference thereto.

This application contains subject matter related to a previously-filed U.S. patent application by Bruce A. Liikanen and Larry J. Koudele titled "MEMORY DEVICE WITH PROGRAMMING CALIBRATION." The related application is assigned to Micron Technology, Inc., and is identified by application Ser. No. 15/605,853, which was filed on May 25, 2017. The subject matter thereof is incorporated herein by reference thereto.

This application contains subject matter related to an U.S. patent application by Michael Sheperek, Larry J. Koudele and Steve Kientz titled "MEMORY SYSTEM WITH DYNAMIC CALIBRATION USING A TRIM MANAGEMENT MECHANISM." The related application is assigned to Micron Technology, Inc., and is identified by application Ser. No. 15/981,810, which was filed on May 16, 2018. The subject matter thereof is incorporated herein by reference thereto.

TECHNICAL FIELD

Embodiments of the disclosure relate generally to memory systems, and, in particular, to memory systems with dynamic calibration using a convergence mechanism.

BACKGROUND

A memory system can be a storage system, such as a solid-state drive (SSD), and can include one or more memory components that store data. For example, a memory system can include memory devices such as non-volatile memory devices, volatile memory devices, or a combination of both. In general, a host system can utilize a memory system to store data at the memory devices of the memory system and to retrieve data stored at the memory system.

BRIEF DESCRIPTION OF THE DRAWINGS

The disclosure will be understood more fully from the detailed description given below and from the accompanying drawings of various embodiments of the disclosure. The drawings, however, should not be taken to limit the disclosure to the specific embodiments, but are for explanation and understanding only.

DETAILED DESCRIPTION

Figure 1:
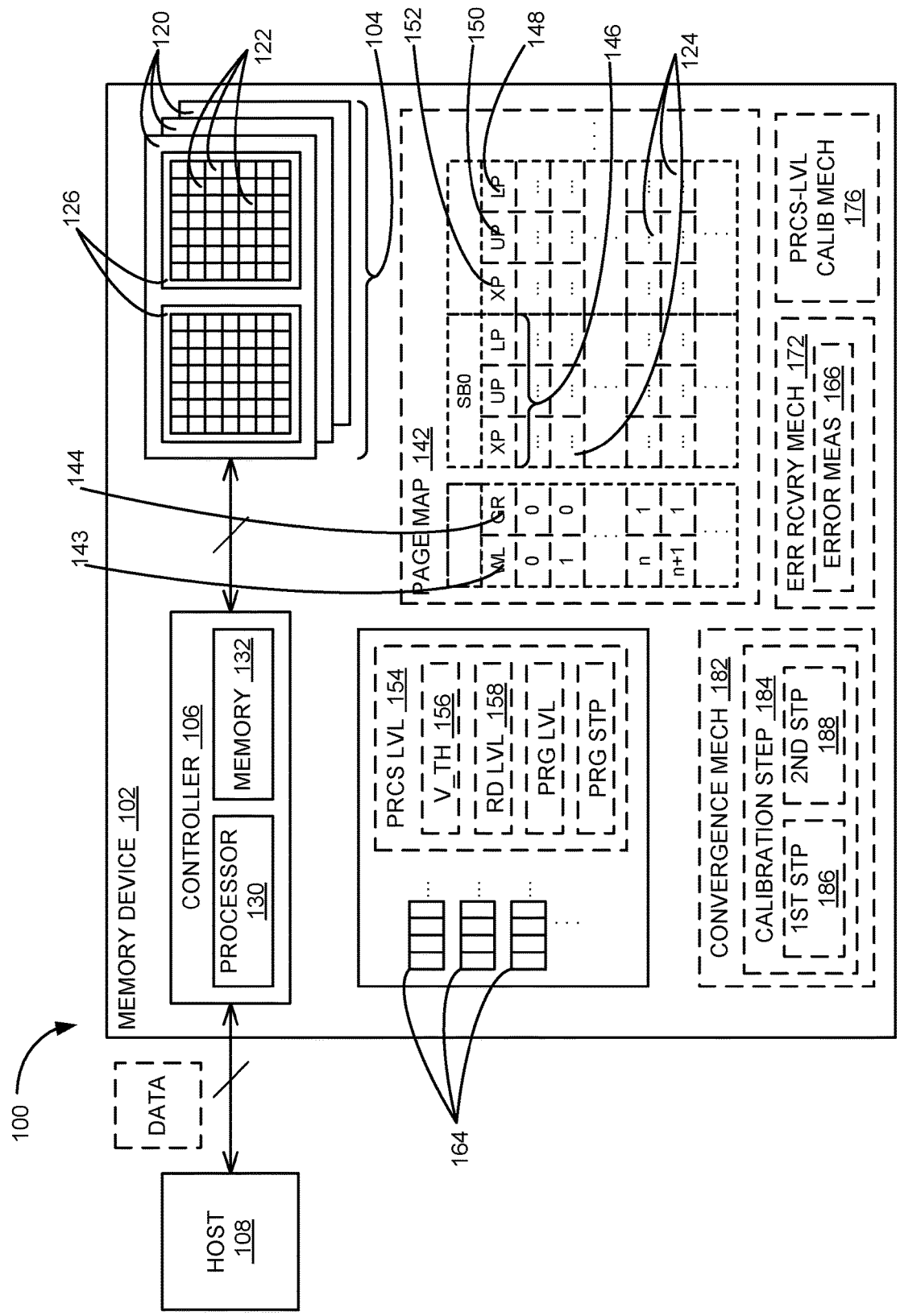
FIG. 1 illustrates an example computing environment that includes a memory system in accordance with some embodiments of the present disclosure.

Aspects of the present disclosure are directed to memory systems for dynamically and continuously calibrating processing levels (e.g., read levels). A memory system can be a storage system, such as a solid-state drive (SSD). In some embodiments, the memory system is a hybrid memory/storage system. In general, a host system can utilize a memory system that include media, such as one or more memory devices. The memory devices can include non-volatile memory devices, such as, for example, negative-and (NAND). The host system can provide write requests to store data at the memory devices of the memory system and can provide read requests to retrieve data stored at the memory system.

In storing (e.g., writing) and accessing (e.g., reading) the information, the memory system can use processing levels to perform the operation. For example, the memory system can use read level voltages to determine an amount of charge and the corresponding bit value stored at a read location. However, due to variations in the storage circuit (e.g., the NAND memory cells), the processing levels can differ across the memory devices. Also, the processing levels can change as the capacity (e.g., charge-holding capability) of each memory device degrades over time and use, such as due to wear (e.g., break-down in oxide layers of the storage circuit).

The processing levels can be tested and calibrated during the manufacturing process to account for the circuit variations, and in some embodiments, during/after deployment as well. The read level voltages can be iteratively adjusted and tested until a test condition (e.g., a condition corresponding to reduction/minimization of error counts/measures) is met. The iterative adjustments can be made according to a predetermined increment size, allowing the calibration process to arrive at the test condition at a convergence rate. While the iterative calibration provides improved performance, improving the convergence rate can further provide processing efficiency.

Memory devices, such as flash memory, utilize electrical energy, along with corresponding threshold levels or processing voltage levels, to store and access data. However, the performance or characteristics of the flash memory devices change or degrade over time or usage. The change in performance or characteristics can conflict with the threshold or processing voltage levels over time, leading to errors and other performance issues.

Aspects of the present disclosure address the above and other deficiencies by implementing a dynamic and continuous read level calibration using a variable adjustment mechanism. The present disclosure includes a memory system that can gather multiple samples/results (e.g., read results) using different processing levels (e.g., read levels). Using the gathered samples, the memory system can calculate a feedback measure, such as an error count/rate, a representation of a read-window budget (RWB) or a distribution valley, etc., that corresponds to each of the processing levels for a page type. Accordingly, the memory system can compare the error measures and determine an update direction (e.g., increase or decrease) that lowers the error measure. The memory system can adjust the processing level along the update direction.

In adjusting the processing level, the memory system can utilize a set of adjustment/update steps that have different magnitudes. For example, the memory system can iteratively update the processing level initially using the update step having a larger magnitude. The memory system can switch to using a smaller step when the memory system detects a changing condition, such as a determination of a dither that represents a change in a pattern/direction of adjustment, such as when the adjustment in the read level changes from decreasing to increasing the value or vice versa. A dither is a change in a trend or a pattern in direction/polarity (e.g., increasing to decreasing in voltage or vice versa) of the calibration adjustments.

FIG. 1 is a block diagram of a computing environment 100 with dynamic processing level calibration mechanism configured in accordance with an embodiment of the present technology. The computing environment 100 includes a memory system 102. As shown, the memory system 102 includes one or more memory devices 104 (e.g., NAND flash) and a controller 106. The memory system 102 can operably couple the memory devices 104 to a host device 108 (e.g., an upstream central processor (CPU)). The memory devices 104 can include circuitry configured to store data in the memory devices 104 and provide access to data in the memory devices 104. The memory devices 104 can be provided as semiconductor, integrated circuits and/or external removable devices in computers or other electronic devices. The memory devices 104 includes one or more memory regions, or memory units 120. The memory units 120 can be individual memory dies, memory planes in a single memory die, a stack of memory dies vertically connected with through-silicon vias (TSVs), or the like. In one embodiment, each of the memory units 120 can be formed from a semiconductor die and arranged with other memory unit dies in a single device package (not shown). In other embodiments, one or more of the memory units 120 can be co-located on a single die and/or distributed across multiple device packages. The memory system 102 and/or the individual memory units 120 can also include other circuit components (not shown), such as multiplexers, decoders, buffers, read/write drivers, address registers, data out/data in registers, etc., for accessing and/or programming (e.g., writing) the data and other functionality, such as for processing information and/or communicating with the controller 106.

Each of the memory units 120 includes an array of memory cells 122 that each store data in a charge storage structure. The memory cells 122 can include, for example, floating gate, charge trap, phase change, ferroelectric, magnetoresitive, and/or other suitable storage elements configured to store data persistently or semi-persistently. The memory cells 122 can be one-transistor memory cells that can be programmed to a target state to represent information. For instance, electric charge can be placed on, or removed from, the charge storage structure (e.g., the charge trap or the floating gate) of the memory cell 122 to program the cell to a particular data state. The stored charge on the charge storage structure of the memory cell 122 can indicate a threshold voltage (Vt) of the cell. For example, a single level cell (SLC) can be programmed to a targeted one of two different data states corresponding to different threshold voltages which can represent the binary units 1 or 0.

Some memory cells (e.g., flash memory cells) can be programmed to a targeted one of more than two data states. For example, a memory cell that can be programmed to any one of four states (e.g., represented by the binary 00, 01, 10, 11) can be used to store two bits of data, and may be referred to as a multilevel cell (MLC). Still other memory cells can be programmed to any one of eight data states (e.g., 000, 001, 010, 011, 100, 101, 110, 111), permitting the storage of three bits of data in a single cell. Such cells may be referred to as triple level cells (TLC). Even higher number of data states are possible, such as those found in quad level cells (QLC), which can be programmed to any one of 16 data states (e.g., 0000, 0001, 0010, 0011, 0100, 0101, 0110, 0111, 1000, 1001, 1010, 1011, 1100, 1101, 1110, 1111) for storing four bits of data. The memory cells 122 capable of storing higher numbers of data states can provide higher density memories without increasing the number of memory cells, since each cell can represent more than one bit.

The memory cells 122 can be arranged in rows (e.g., each corresponding to a word line 143) and columns (e.g., each corresponding to a bit line). Each word line 143 can include one or more memory pages 124, depending upon the number of data states the memory cells 122 of that word line 143 are configured to store. For example, a single word line of the memory cells 122 that are each configured to store one of two data states (e.g., SLC memory cells configured to store one bit each) can include a single memory page 124. Alternatively, a single word line 143 of the memory cells 122 that are each configured to store one of four data states (e.g., MLC memory cells configured to store two bits each) can include two memory pages 124. Moreover, within the word line 143, pages 124 can be interleaved so that the word line 143 of memory cells 122 that are each configured to store one of two data states (e.g., SLC memory cells) can include two pages, in an "even-odd bit line architecture" (e.g., where all the memory cells 122 in odd-numbered columns of a single word line 143 are grouped as a first page, and all the memory cells 122 in even-numbered columns of the same word line 143 are grouped as a second page). When even-odd bit line architecture is utilized in the word line 143 of memory cells 122 that are each configured to store larger numbers of data states (e.g., memory cells configured as MLC, TLC, QLC, etc.), the number of pages per word line 143 can be even higher (e.g., 4, 6, 8, etc.). Each column can include a string of series-coupled memory cells 122 coupled to a common source. The memory cells 122 of each string can be connected in series between a source select transistor (e.g., a field-effect transistor) and a drain select transistor (e.g., a field-effect transistor). Source select transistors can be commonly coupled to a source select line, and drain select transistors can be commonly coupled to a drain select line.

The memory system 102 can process data using different groupings of the memory cells 122. For example, the memory pages 124 of the memory cells 122 can be grouped into memory blocks 126. In operation, the data can be written or otherwise programmed (e.g., erased) with regards to the various memory regions of the memory system 102, such as by writing to groups of pages 124 and/or memory blocks 126. In NAND-based memory, a write operation often includes programming the memory cells 122 in selected memory pages 124 with specific data values (e.g., a string of data bits having a value of either logic 0 or logic 1). An erase operation is similar to a write operation, except that the erase operation re-programs an entire memory block 126 or multiple memory blocks 126 to the same data state (e.g., logic 0).

In other embodiments, the memory cells 122 can be arranged in different types of groups and/or hierarchies than shown in the illustrated embodiments. Further, while shown in the illustrated embodiments with a certain number of memory cells, rows, columns, blocks, and memory units for purposes of illustration, in other embodiments, the number of memory cells, rows, columns, blocks, and memory units can vary, and can be larger or smaller in scale than shown in the illustrated examples. For example, in some embodiments, the memory system 102 can include only one memory unit 120. Alternatively, the memory system 102 can include two, three, four, eight, ten, or more (e.g., 16, 32, 64, or more) memory units 120. While the memory units 120 are shown in FIG. 1 as including two memory blocks 126 each, in other embodiments, each memory unit 120 can include one, three, four eight, or more (e.g., 16, 32, 64, 100, 128, 256 or more memory blocks). In some embodiments, each memory block 123 can include, e.g., 215 memory pages, and each memory page within a block can include, e.g., 212 memory cells 122 (e.g., a "4k" page).

The controller 106 can be a microcontroller, special purpose logic circuitry (e.g., a field programmable gate array (FPGA), an application specific integrated circuit (ASIC), etc.), or other suitable processor. The controller 106 can include a processor 130 configured to execute instructions stored in memory. In the illustrated example, the memory of the controller 106 includes an embedded memory 132 configured to perform various processes, logic flows, and routines for controlling operation of the computing environment 100, including managing the memory system 102 and handling communications between the memory system 102 and the host device 108. In some embodiments, the embedded memory 132 can include memory registers storing, e.g., memory pointers, fetched data, etc. The embedded memory 132 can also include read-only memory (ROM) for storing micro-code. While the exemplary memory system 102 illustrated in FIG. 1 has been illustrated as including the controller 106, in another embodiment of the present technology, a memory device may not include a controller, and may instead rely upon external control (e.g., provided by an external host, or by a processor or controller separate from the memory system).

In the illustrated example, further organization or details of the memory devices 104 are represented with a page map 142. The page map 142 can represent groupings, addresses, types, or a combination thereof for the memory pages 124 for each of the memory blocks 126. For example, each of the memory blocks 126 can include the memory pages 124 corresponding to a word-line group 144. Also for example, the memory pages 124 can further correspond to a logical page type 146, such as a lower page (LP) 148, an upper page (UP) 150, an extra page (EP) 152, or a top page (TP) (not shown).

The word-line group 144 can include a grouping of the memory pages 124 corresponding to one or more word lines 143 used to implement processing functions, such as read or write for the data. The word-line group 144 can be a grouping of the memory pages 124 for or connected to the word line 143. The word line 143 can correspond to physical layout or architecture of the memory cells 122.

The page type 146, such as for the upper page 150, the lower page 148, and the extra page 152, can represent a grouping of bits in a specific order for the memory pages 124. The types of pages can correspond to a logical layout, architecture, or value for the memory cells 122. For example, the lower page 148 can represent a first information bit stored in the memory pages 124 or the memory cells 122 therein. The lower page 148 can be for SLC type of cells, MLC type of cells, TLC type of cells, or a combination thereof. Also for example, the upper page 150 can correspond to or represent a second information bit stored in the memory pages 124 or the memory cells 122 therein. The upper page 150 can be for the TLC or MLC types of the memory cells 122. Also for example, the extra page 152 can represent a third information bit, such as for the most significant bit or the least significant bit, stored in the memory pages 124 or the memory cells 122 therein. The extra page 152 can be for the TLC type of the memory cells 122.

The memory system 102 can use processing levels 154 for storing or accessing data. The processing levels 154 can include thresholds or operating levels for voltage or current. For example, the processing levels 154 can include a threshold voltage 156, a read level voltage 158, a programming level voltage, a programming step, or a combination thereof. The threshold voltage 156 can be the voltage applied to the control gate at which the circuitry for the memory cells 122 becomes conductive and a current can be measured. The threshold voltage 156 can be affected and controlled by controlling an amount of charge held in a floating gate or charge trap of the memory cells 122. The memory system 102 can store an amount of charge into the memory cells 122 based on the programming level voltage to represent a corresponding data value. The memory system 102 applies the programming level voltage to control gate or word line to charge up the floating gate or the charge trap. The floating gate or the charge trap can be electrically isolated, which can enable the memory cell to store and hold the charge.

The memory system 102 can use the stored charge to represent data. For example, storing charges on the floating gate or the charge trap can be for storing a bit value of 0 for SLC type cells. A bit value of 1 can correspond to the floating gate or the charge trap with no stored charge for the SLC. In other types of cells, such as for MLC, TLC, or QLC, the memory system 102 can store specific amounts of charge on the floating gate or the charge trap to represent different bit values. The MLC type of cell can have four different charge states, TLC can have eight different charge states, and QLC can have 16 different charge states. Each of the charge states can correspond to a unique binary value as discussed above.

The memory system 102 can read or determine data values stored in the memory cells 122 using the read level voltage 158 corresponding to the data value. The memory system 102 can apply the read level voltage 158 to the control gate and measure the current or the voltage across the memory cell to read the data stored in the cell. The charges stored in the floating gate or the charge trap can screen off or offset the amount of charge placed on control gate for reading or accessing the stored data. As such, with the read level voltage 158 applied, the measured the current or the voltage across the memory cell will correspond to the amount of charges stored in the floating gate or the charge trap.

During operation of the memory system 102, the electrical characteristics of the device (i.e. charge retention capabilities) can change due to repeated data writes, erase, and/or reads. The repeated data operations can lead to the breakdown or wearing of the dielectric structure electrically isolating the floating gate or the charge trap (e.g. the oxide layers).

The memory system 102 can include a convergence mechanism 182 to account for the changing electrical characteristics of the memory cells 122 by shifting or calibrating the read level voltage 158. In some embodiments, the controller 106 includes a convergence mechanism 182. In some embodiments, the convergence mechanism 182 is part of the host system 108, an application, or an operating system.

The programming level voltage is associated with the read level voltage 158 and the threshold voltage 156. The programming level voltage, the read level voltage 158, the threshold voltage 156 or a combination thereof can correspond to the number of bits stored in the memory cells 122.

For example, memory cells 122 configured to store charge in one of two possible states (e.g., SLC memory cells) may have associated programming levels, read levels and threshold voltages that are different from those used with of memory cells 122 configured to store charge in one of four possible states (e.g., MLC memory cells) or memory cells 122 configured to store charge in one of eight possible states (e.g., TLC memory cells). For each type of memory cell (e.g., SLC, MLC, TLC, QLC, etc.), a specific value of the programming level voltage, the read level voltage 158, the threshold voltage 156, or a combination thereof can be associated with each of the possible data values. The memory system 102 can iteratively store charge in the memory cells 122 for the write or program operation, such as for incremental step pulse programming (ISPP). The programming step can include an increment or a voltage value for increasing the stored charge in each iteration.

The processing levels 154 can be stored in the memory system 102, the host device 108, or a combination thereof. For example, the memory system 102 can include one or more level registers 164 on the controller 106, the memory devices 104, another memory location of the memory system 102, or a combination thereof for storing the processing levels 154. The level registers 164 can store the threshold voltage 156, the read level voltage 158, the programming level voltage, the programming step, or a combination thereof. The memory system 102, controller 106, and/or the host 108 can access the level registers 164, write or adjust the values in the level registers 164, or a combination thereof. Similarly, the processing levels 154 can be stored in the embedded memory of the controller 106, the memory devices 104, another memory location of the memory system 102, or a combination thereof.

The memory system 102 can track an error measure 166. The error measure 166 can represent a degree, a frequency, an amount or magnitude, a size or number, a processing derivation of the errors, or a combination thereof describing the errors. For example, the error measure 166 can include an error count, an error rate, or a combination thereof. The error count can represent an amount or magnitude, a degree, a size or number, or a combination thereof describing the errors. For example, the error count can be a bit error count (BEC). The error rate can represent a frequency or a probability of occurrence of the errors, a proportional amount or a percentage of errors, or a combination thereof. For example, the error rate can include a bit error rate (BER). The error measure 166 can correspond to one or more units or groupings within the memory devices 104. For example, the error measure 166 can be for one or more of the memory pages 124, the memory cells 122, the word-line group 144, a die, or a combination thereof. Also for example, the error measure 166 can correspond to the page type 146, such as for the lower page 148, the upper page 150, or the extra page 152. The error measure 166 can be calculated or tracked by the host device 108, the controller 106, or a combination thereof. The error measure 166 can be stored in the host device 108, the embedded memory of the controller 106, the memory devices 104, another memory location of the memory system 102, or a combination thereof.

The memory system 102 can dynamically calculate or adjust the processing levels 154 based on feedback information. For example, the memory system 102 can continuously update the read level voltage 158 using a processing-level calibration mechanism 176. The processing-level calibration mechanism 176 can be a process, method, function, circuitry, configuration, or a combination thereof for implementing the above mentioned calibration.

For illustrative purposes, the processing-level calibration mechanism 176 (e.g., cRLC) is described below using the read level voltage 158. However, it is understood that the processing-level calibration mechanism 176 can be implemented for the threshold voltage 156 of FIG. 1, the programming level voltage, the programming step, or a combination thereof.

In some embodiments, the memory system 102 can use a convergence mechanism 182 to implement the processing-level calibration mechanism 176. The convergence mechanism 182 can include a set of processes/sequences/instructions for adjusting a calibration step 184. For example, for each iteration, the memory system 102 can adjust the read level voltage 158 by an amount (e.g., one or more clicks) specified by the calibration step 184. The clicks can correspond to increments/granularity of the digital-to-analog converter (DAC) (not shown) utilized in the memory system 102.

Using the convergence mechanism 182, the memory system 102 can dynamically change the calibration step 184 from a first step size 186 to a second step size 188 that is bigger or smaller than the first step size 186. In some embodiments, the convergence mechanism 182 can change the magnitude of the calibration step 184 based on detecting a dither condition, where a trend or a pattern in the adjustments changes direction/polarity (e.g., increasing to decreasing in voltage or vice versa).

Figure 2C:
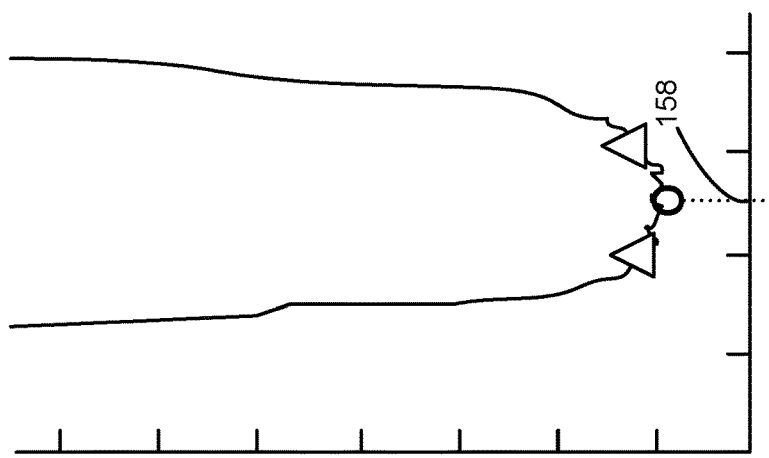
FIGS. 2A, 2B and 2C illustrate an example of a progression for the processing-level calibration mechanism in FIG. 1 in accordance with an embodiment of the present technology.
Figure 2B:
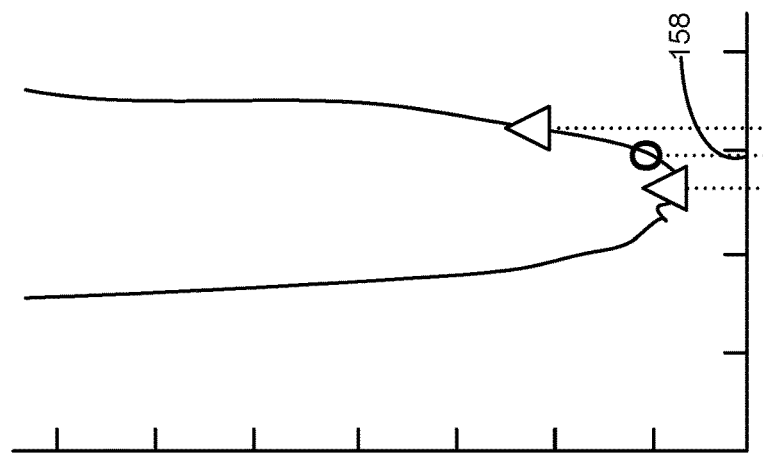
Figure 2A:
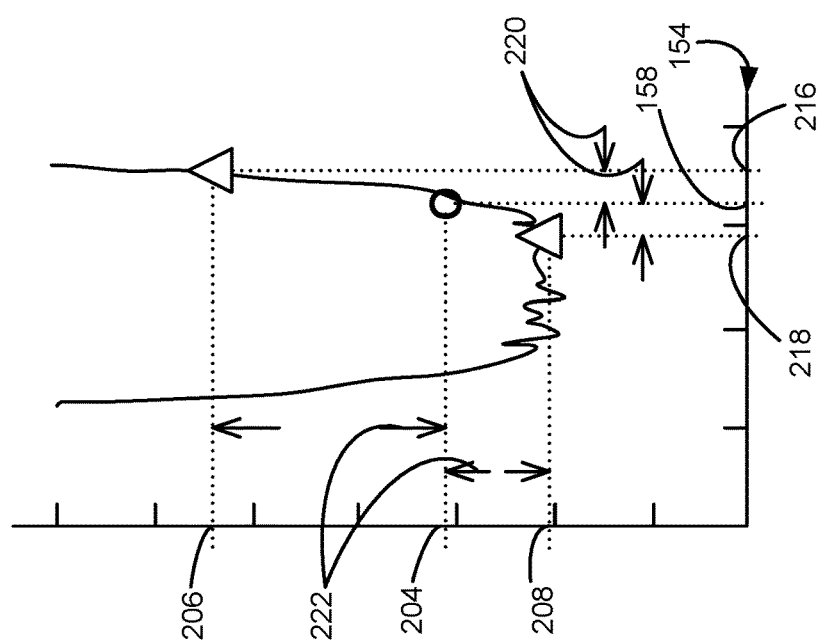

FIGS. 2A, 2B, and 2C show charts correlating the error measure 166 of FIG. 1 (shown along the Y-axis) of a memory page with the read voltage (shown along the X-axis) used to read the data from the cells in accordance with an embodiment of the present technology. In this regard, FIGS. 2A, 2B and 2C show a progression for the processing-level calibration mechanism 176 of FIG. 1 adjusting the read level voltage 158 to reduce the error count 168. The illustrated progression can occur using the adjustable/varying step sizes according to the convergence mechanism 182 of FIG. 1. While the figures illustrate an embodiment in which the calibration mechanism uses a measured error count to calibrate a read level voltage, the present technology may be used, in other embodiments, to similarly calibrate other processing levels (e.g., program voltage, threshold level, etc.) in view of other measured characteristics (bit error rate, etc.).

FIGS. 2A through 2C illustrate sequential changes, adjustments, or calibrations in the read level voltage 158 and the corresponding samples and results as the processing-level calibration mechanism 176 is implemented. The memory system 102 of FIG. 1 can implement the processing-level calibration mechanism 176 including iterative changes, adjustments, or calibrations in the read level voltage 158. The memory system 102 can further implement the processing-level calibration mechanism 176 multiple times over a duration to iteratively adjust the read level voltage 158.

FIG. 2A illustrates an example behavior prior to or in the absence of implementing the processing-level calibration mechanism 176, in accordance with embodiments of the present disclosure. In initiating or implementing the processing-level calibration mechanism 176, the memory system 102 can use one or more of the components therein to sample data and generate or update a test measurement set. The test measurement set can include a center result 204, a first offset result 206, a second offset result 208, other results, or a combination thereof. The memory system 102 can generate or update the test measurement set based on determining results corresponding to a set of read operations using the read level voltage 158 or using a voltage offset from the read level voltage 158.

For example, the memory system 102 can determine the center result 204 based on determining the error count 168 corresponding to data read or accessed using the read level voltage 158 for a particular page type of an instance of the memory pages 124 of FIG. 1. The center result 204 corresponding to original, unadjusted, or uncalibrated instance of the read level voltage 158 is represented as "O" in FIG. 2A.

The memory system 102 can similarly determine the first offset result 206 based on determining the error count 168 corresponding to data read or accessed using a first offset level 216. The memory system 102 can similarly determine the second offset result 208 based on determining the error count 168 corresponding to data read or accessed using a second offset level 218. The first offset level 216 is indicated by the vertical dotted line leading from the x-axis up to the plot. The corresponding location of the plot is shown as a triangle located to the right and above the center result 204 in FIG. 2A. The second offset level 218 is indicated by the vertical dotted line leading from the x-axis to the plot with the corresponding location on the plot located to the left and below the center result 204 in FIG. 2A.

The first offset level 216 and the second offset level 218 can each be a voltage level for reading or accessing data stored in corresponding instances of the memory cells 122 of FIG. 1. The first offset level 216 and the second offset level 218 can be values different from each other and different from the read level voltage 158. For example, the first offset level 216 can be greater than the read level voltage 158. Also for example, the second offset level 218 can be lesser than the read level voltage 158.

Also for example, the first offset level 216, the second offset level 218, or a combination thereof can be offset from the read level voltage 158 by an offset measure 220. The offset measure 220 can represent a separation or an offset amount from the read level voltage 158 for one or more of the offset levels. In some embodiments, the offset measure 220 can be one or more clicks or units of movement. The offset measure 220 can further represent a direction or a sign, a degree or a magnitude, or a combination thereof for the offset.

In implementing the processing-level calibration mechanism 176, the memory system 102 can select a die, a memory block, a memory page, a trim or the read level voltage 158 corresponding to one page type for the page, or a combination thereof. The selection can be made at random or according to an iterative process/pattern. Following the selection, the memory system 100 can sample at least the center result 204, the first offset result 206 and the second offset result 208 for the test measurement set. In some embodiments, the memory system 102 can use the first offset level 216 and the second offset level 218 both offset from the read level voltage 158 by the offset measure 220 in opposite directions. The memory system 102 can use the center result 204, the first offset result 206 and the second offset result 208 to adjust or calibrate the read level voltage 158.

The memory system 102 can calibrate the read level voltage 158, such as through adjusting or updating a previous value/level, based on comparing or balancing the various results. In some embodiments, the memory system 102 can additionally calibrate the read level voltage 158 using the processing-level calibration mechanism 176 during or as part of manufacture, configuration, or set up of the memory system 102 FIG. 1, before intended deployment or usage thereof.

FIG. 2B illustrates an example read level voltage 158 that has been adjusted or calibrated in comparison to the read level voltage 158 illustrated in FIG. 2A, in accordance with embodiments of the present disclosure. For one or more iterations between FIG. 2A and FIG. 2B, the read level voltage 158 can be adjusted according to a first/bigger increment size.

FIG. 2B can represent a moment (e.g., for one of the iterations) during implementation of the processing-level calibration mechanism 176 before the read level voltage 158 has settled or centered along the plot. The read level voltage 158 is illustrated in FIG. 2B as being lower or further left than in FIG. 2A. However, it is understood that the read level voltage 158 can be adjusted in any direction and by any increments or values. The processing-level calibration mechanism 176 can adjust the read level voltage 158 to decrease the error measure 166 for the corresponding memory cells 122, such as according to current condition or characteristics of the memory cells 122.

The read level voltage 158 can be calibrated in a variety of ways. In some embodiments, the read level voltage 158 can be incremented or shifted by a predetermined amount or increment (e.g., clicks) based on comparing or balancing the various results. For example, the read level voltage 158 can be incremented according to the convergence mechanism 182 of FIG. 1, such as by initially using the first step size 186 of FIG. 1 that is larger than the second step size 188 of FIG. 1. Based on detecting a condition (e.g., the dither condition), the read level voltage 158 can be incremented using the second step size 188. In some embodiments, the read level voltage 158 can be assigned a predetermined value corresponding to one or more results of the sampling process. In some embodiments, the read level voltage 158 can be replaced by the first offset level 216 or the second offset level 218 based on one or more of the results.

In some embodiments, the memory system 102 can use the updated/adjusted instance of the read level voltage 158 to calculate new offset levels. The memory system 102 can use the updated/adjusted value of the read level voltage 158 to read the data for latter or subsequent iterations/implementations of the processing-level calibration mechanism 176. The results of the corresponding reads can be processed, and the read level voltage 158 can further be calibrated accordingly. For example, between iterations, the controller 106 can adjust (e.g., increase or decrease) the read level voltage 158 according to the offset/read level that corresponds to the lowest amongst the center result 204, the first offset result 206, the second offset result 208, etc.

Accordingly, the read level voltage 158, the first offset level 216, and the second offset level 218 can be different between/across the iterations as illustrated in FIG. 2A through FIG. 2C. The process can repeat until the read level voltage 158 and the corresponding results satisfy a stop or a break condition (e.g., a centered status/determination, a maximum iteration limit, etc.).

FIG. 2C illustrates an example behavior/condition at an end or after implementation of the processing-level calibration mechanism 176, in accordance with embodiments of the present disclosure. For one or more iterations between FIG. 2B and FIG. 2C, the read level voltage 158 can be adjusted according to a different/smaller increment size.

As illustrated, implementation of the processing-level calibration mechanism 176 can calibrate the read level voltage 158 to be located at or within a threshold distance from a bottom or minimum (e.g., center) of the error-read level correlation plot. The processing-level calibration mechanism 176 can find a read level voltage 158 that reduces read errors based on iteratively testing different possible values of the read level voltage 158 and comparing the corresponding error counts.

The processing-level calibration mechanism 176 can iteratively calibrate the read level voltage 158 until the tested read level is estimated as the read level that generates the lowest error count/rate, such as being centered along the error/read-level plot as illustrated in FIGS. 2A-2C. In some embodiments, the controller 106 can estimate that the read level is centered based on differences from the center result 204 and the surrounding read levels have opposing signs (e.g., positive and negative). Further, the controller 106 can estimate the center status based on further determining equal or similar (e.g., within a threshold) magnitudes in the differences between the center result 204 and the surrounding read levels. In some embodiments, the controller 106 can estimate that the read level is centered when a calibration pattern changes across iterations. For example, the controller 106 can store whether the read level settings were increased or decreased during one or more of the previous iterations. The controller 106 can determine the dithering status when the adjustment direction changes (e.g., increase to decrease or vice versa). As illustrated in FIGS. 2A-2C, the controller 106 can determine the dithering status when the adjustments to the read level settings change from decrease/subtraction operations, such as from adjusting the read level settings to move left, to increase/addition operation.

In implementing the processing-level calibration mechanism 176, the memory system 102 can execute the convergence mechanism 182 (e.g., circuitry, dedicated logic, programmable logic, firmware, etc.) to perform the operations described herein. In some embodiments, the controller 106 includes a convergence mechanism 182. For example, the controller 106 can include a processor 130 (processing device) configured to execute instructions stored in local memory 132 for performing the operations described herein. In some embodiments, the convergence mechanism 182 is part of the host system 108, an application, or an operating system. The convergence mechanism 182 can initially adjust the read levels by the first step size 186 (e.g., 5 clicks) until the convergence mechanism 182 detects the dither condition. After detecting the dither condition, the convergence mechanism 182 can further iteratively calibrate the read level settings using the second step size 188 (e.g., 1 click). The convergence mechanism 182 can calibrate the read level settings with the smaller step increments until it detects another dither condition. By initially using a bigger step size and then switching to a smaller step size, the convergence mechanism 182 provides faster convergence to the desired read-level voltage. The larger step sizes can approach the center location of the error-read level plot faster. Subsequently switching to a smaller step size can recapture the finer granularity and bring the read level setting closer to the center location.

Figure 3A:
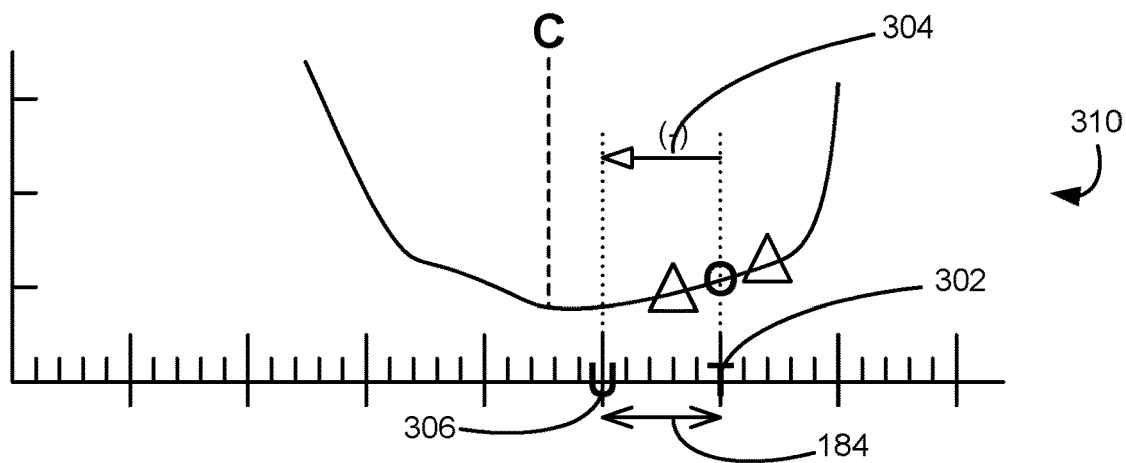
FIGS. 3A, 3B, and 3C illustrate calibration results at various iterations in accordance with an embodiment of the present technology.
Figure 3B:
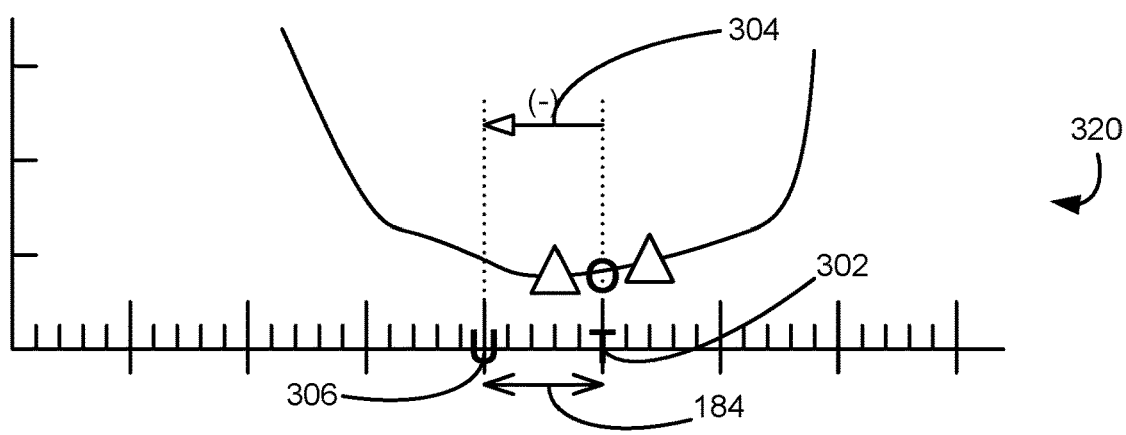
Figure 3C:
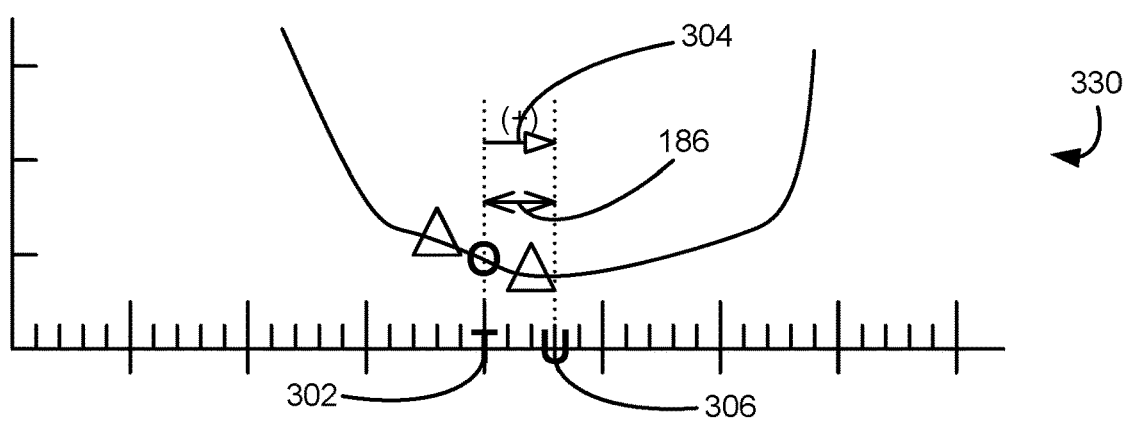

FIGS. 3A, 3B, and 3C illustrate example calibration results at various iterations in accordance with an embodiment of the present technology. In this regard, FIGS. 3A-3C illustrate an example set of consecutive iterations implementing the convergence mechanism 182 of FIG. 1, switching between the first step size 186 and the second step size 188.

FIG. 3A illustrates examples of a state or a set of results associated with one of the iterations (e.g., a first iteration 310 representing an nth iteration for discussion purposes) in implementing the processing-level calibration mechanism 176 of FIG. 1. For the first iteration 310, the controller 106 of FIG. 1 can test a read level setting (e.g., a tested read level 302) as a center read level. The controller 106 can utilize the error measure 166 associated with the center read level along with one or more levels offset therefrom (e.g., the first offset level 216 of FIG. 2 and/or the second offset level 218 of FIG. 2) to calculate an update direction 304, such as to increase or decrease the read level setting. For example, the controller 106 can calculate the update direction 304 as a direction that goes from the center result 204 of FIG. 2 to a lower of the first offset result 206 of FIG. 2 or the second offset result 208 of FIG. 2.

As illustrated in FIG. 3A, the controller 106 can determine that the second offset level 218 (e.g., a read level that is less than the center level) produces the second offset result 208 that is less than the center result 204 and/or the first offset result 206 (e.g., an error measure corresponding to a read level greater than the center level). Accordingly, the controller 106 can calculate the update direction 304 as going 'left' or decreasing the read level setting.

Based on the update direction 304, the controller 106 can use one of the predetermined calibration steps according to the convergence mechanism 182 of FIG. 1. Initially or before detection of any dithering condition, the controller 106 can calculate an updated read level 306 based on adjusting the tested read level 302 by the biggest calibration step (e.g., the first step size 186) of the predetermined set along the update direction 304. As illustrated in FIG. 3A, the controller 106 can calculate the updated read level 306 as a read level that is five clicks less than the tested read level 302.

FIG. 3B illustrates a state or a set of results associated with a subsequent iteration (e.g., a second iteration 320 representing an (n+1)th iteration) in implementing the processing-level calibration mechanism 176. The controller 106 can set the updated read level 306 of the first iteration 310 as the tested read level 302 (e.g., the center read level) of the second iteration 320. The memory system 102 (e.g., the controller 106, the host device 108 of FIG. 1, and/or the memory devices 104 of FIG. 1) can calculate the offset levels (e.g., the first offset level 216 and/or the second offset level 218, etc.) based on the tested read level 302 that was updated in the previous iteration. The memory system 102 can calculate the error measures that correspond to the different read levels as discussed above.

As illustrated in FIG. 3B, the controller 106 can again determine that the second offset level 218 produces the second offset result 208 that is less than the center result 204 and/or the first offset result 206. Accordingly, the controller 106 can calculate the update direction 304 as going 'left' or decreasing the read level setting. Further, for the second iteration 320, the controller 106 can continue to apply the first step size 186 and calculate the updated read level 306 as a read level that is five clicks less than the tested read level 302.

In using the biggest step size (e.g., the first step size 186), the controller 106 can overshoot a read level that can lower the error measure. As illustrated in FIG. 3B, the controller 106 can overshoot a center point (illustrated with 'C' in FIG. 3A) of the error-read level correlation plot.

FIG. 3C illustrates examples of a state or a set of results associated with a next subsequent iteration (e.g., a third iteration 330 representing an (n+2)th iteration) in implementing the processing-level calibration mechanism 176. The controller 106 can set the updated read level 306 of the second iteration 320 as the tested read level 302 (e.g., the center read level) of the third iteration 330. The memory system 102 (e.g., the controller 106, the host device 108, and/or the memory devices 104) can calculate the offset levels (e.g., the first offset level 216 and/or the second offset level 218, etc.) based on the tested read level 302 that was updated in the previous iteration. The memory system 102 can calculate the error measures that correspond to the different read levels as discussed above.

As illustrated in FIG. 3C, the controller 106 can determine that the first offset level 216 produces the first offset result 206 (e.g., represented by a triangle located right of the 'O') that is less than the tested read level 302 and/or the second offset result 208 (e.g., represented by a triangle located left of the 'O'). Accordingly, unlike the previous iterations, the controller 106 can calculate the update direction 304 as going 'right' or increasing the read level setting.

The memory system 102 can store the update direction 304 across iterations. When the update direction 304 changes polarity/direction across iterations, the memory system 102 (e.g., the controller 106) can determine a dither. For example, the controller 106 can determine the dither at the third iteration 330 based on the update direction 304 (e.g., right/increase in the third iteration 330) being different from the previous iteration (e.g., left/decrease in the second iteration 320).

Based on determining the dithering status, the memory system 102 can use a next-smaller calibration step (e.g., the second step size 188) to calculate the updated read level 306. As illustrated in FIG. 3C, the controller 106 can apply the second step size 188 and calculate the updated read level 306 as a read level that is three clicks greater than the tested read level 302.

For illustrative purposes, the convergence mechanism 182 is discussed using five clicks for the first step size 186 and one or three clicks for the second step size 188. However, it is understood that the step sizes can be different.

Also for illustrative purposes, the convergence mechanism 182 is discussed as utilizing two different step sizes. However, it is understood that the convergence mechanism 182 can utilize three or more different step sizes. The memory system 102 can sequentially decrease the step sizes. In some embodiments, the memory system 102 can dynamically calculate a smaller step size. For example, the controller 106 can calculate the step size based on a difference in the error measures across iterations, across left/right results, etc. Further, in some embodiments, the memory system 102 can increase the step sizes under certain conditions, such as after a maximum number of consecutive iterations.

Also for illustrative purposes, FIGS. 2A-2C and 3A-3C illustrate the processing-level calibration mechanism 176 utilizing a set of three read levels (e.g., a center read level, a lower read level, and an upper read level) to generate the read samples, in accordance with embodiments of the present disclosure. However, it is understood that the processing-level calibration mechanism 176 can utilize a set with a different number of read levels, such as two or more. For example, the processing-level calibration mechanism 176 can generate five read results that correspond to a center read level, a first lower level, a second lower level, a first higher level, and a second higher level. The first lower level can be lower than the center read level by the offset measure 220, and the second lower level can be lower than the first lower level by the offset measure 220. Also, the first higher level can be greater than the center read level by the offset measure 220, and the second higher level can be greater than the first higher level by the offset measure 220. The processing-level calibration mechanism 176 can compare the resulting error measures and determine an update direction that lowers the error measure.

Figure 4:
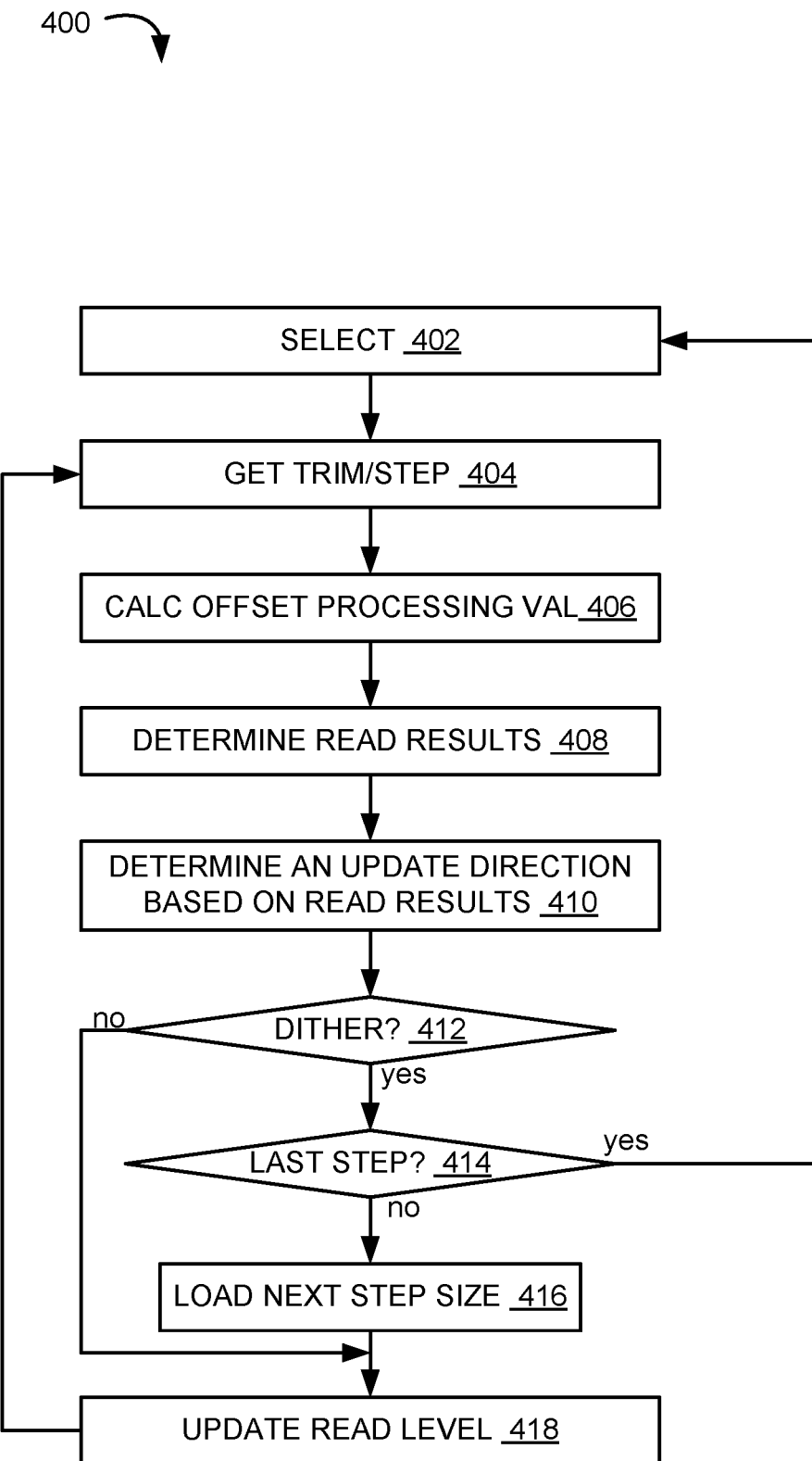
FIG. 4 is a flow diagram of an example method for dynamically and continuously calibrating processing levels, in accordance with an embodiment of the present disclosure.

FIG. 4 is a flow diagram illustrating an example method 400 for calibrating a read level in accordance with an embodiment of the present technology. The method 400 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 400 is performed by the convergence mechanism 182 of FIG. 1. Although shown in a particular sequence or order, unless otherwise specified, the order of the processes can be modified. Thus, the illustrated implementations should be understood only as examples, and the illustrated processes can be performed in a different order, and some processes can be performed in parallel. Additionally, one or more processes can be omitted in various embodiments. Thus, not all processes are required in every implementation. Other process flows are possible.

At block 402, the processing device selects a grouping of the memory cells 122 of FIG. 1 as a target of the calibration process. For example, the processing device can select one of the memory pages 124 of FIG. 1 that is fully-programmed. The selected page can correspond to one or more page types based on the type of selected cells, such as for SLC, MLC, and TLC. The selected page can further correspond to one of the word-line groups 144 and the word line 143, both of FIG. 1. The page selection can be made randomly, iteratively, or a combination thereof. In some embodiments, the processing device can select the page randomly, such as according to a set of instructions/processes for making random selections. In some embodiments, the processing device can select the page according to a predetermined order. The processing device can also select the page based on iteratively selecting through the available/fully-programmed pages.

At block 404, the processing device determines the tested read level 302 of FIG. 3 for the calibration process. For example, the processing device can determine the tested read level 302 based on accessing the trim register (e.g., the level register 164 of FIG. 1) for the processing level 154 of FIG. 1 (e.g., the read level voltage 158 of FIG. 1) stored therein. In some embodiments, the processing device can determine the tested read level 302 for the first iteration. For subsequent iterations, the processing device can dynamically track the tested read level 302 without storing updated levels back in the trim register. In some embodiments, corresponding to the dashed feedback line, the processing device can access the trim register to get the tested read level 302 at each iteration. The processing device and/or the memory devices 104 of FIG. 1 can store the updated levels in the trim register for each iteration.

The processing device can further load a first (e.g., the first step size 186 of FIG. 1) of the update/adjustment step size. For example, the processing device can initially load/use the step size having the largest magnitude amongst the set of available step sizes.

At block 406, the processing device provides one or more offset processing values. For example, the processing device can calculate the first offset level 216 of FIG. 2, the second offset level 218 of FIG. 2, etc. based on the read level voltage 158 and/or the offset measure 220 of FIG. 2. The processing device can calculate the first offset level 216 based on adding the offset measure 220 to the read level voltage 158, or based on shifting in one direction according to the offset measure 220 from the read level voltage 158. The processing device can further calculate the second offset level 218 based on subtracting the offset measure 220 to the read level voltage 158, or based on shifting in an opposite direction according to the offset measure 220 from the read level voltage 158.

At block 408, the processing device determines a set of read results. The read results can include one or more offset results (e.g., the first offset result 206, the second offset result 208, etc.), the center result 204, error measures (e.g., bit error rate, error count, etc.) corresponding thereto, a difference in the error measures, etc. The processing device can read a subset of memory cells according to a set of read levels. The set of read levels can include a center read level, an upper read level, and a lower read level. The processing device can sample (e.g., read) the data using the selected set of processing values/levels. For example, the processing device can read the selected grouping of the memory cells 122 using the read level voltage 158 (e.g., the tested read level 302 or the center level), the first offset level 216, the second offset level 218, etc. In some embodiments, the processing device can issue multiple commands for reading the selected memory cells, such as a command for reading with the tested read level 302, a command for reading with the first offset level 216, and the second offset level 218. In some embodiments, the processing device can issue one command that initiates a process (e.g., a read-offset mechanism) in the memory devices 104 that performs the multiple reads.

According to the multiple commands and/or the preconfigured process of the memory devices 104, the memory devices 104 can generate the read results according to the tested read level 302 and the associated offset level(s). For example, the memory devices 104 can generate the center result 204 based on reading with the tested read level 302, the first offset result 206 based on reading with the first offset level 216, the second offset result 208 based on reading with the second offset level 218, etc. The processing device can determine the set of read results based on receiving the read results from the memory devices 104.

At block 410, the processing device determines an update direction based on the set of read results. The processing device can analyze the determined results and calculate the update direction. For example, the processing device can check/validate the various results made with different read levels. According to the check/validation, the processing device can calculate the error measure (e.g., the error count or the BER) corresponding to each of the tested read level 302, the first offset level 216, the second offset level 218, etc. In some embodiments, the processing device can calculate one or more differences in the error measures, such as a difference between error measures (e.g., a representation of RWB) corresponding to the center result 204 and the first offset result 206, a difference between error measures corresponding to the center result 204 and the second offset result 208, etc.

The processing device can calculate the update direction based on the analysis results (e.g., the error measures or the differences in the error measures). In some embodiments, the processing device can calculate the update direction as a direction, such as either positive (e.g., for increasing the read level) or negative (e.g., for decreasing the read level), that reduces the error measure. For example, the processing device can calculate the update direction as positive when the error measure for the first offset level 216 is less than the error measure for the center result 204, than that for the second offset level 218, or both. Also, the processing device can calculate the update direction as negative when the error measure for the second offset level 218 is less than the error measure for the center result 204, than that for the first offset level 216, or both.

The update direction can be stored, in a data store coupled to the processing device, as a previous direction for access across iterations. At the next subsequent iteration, the processing device can access the stored update direction as the previous direction.

At block 412, the processing device tests for a condition for changing the adjustment step size. The processing device can test for the changing condition based on detecting a change in a pattern associated with the read results, error measures associated thereto, etc. In some embodiments, the processing device can test by determining a dither status. The dither status can include a representation of a change in direction/polarity in the update direction between iterations. For example, the processing device can compare the previous direction of a previous iteration and the update direction of a current iteration. The processing device can determine the dither status 440 when the previous direction 430 and the update direction 304 do not match, such as when the update direction 304 changes from decreasing to increasing or vice versa across iterations.

When the changing condition is not satisfied, the processing device can proceed without altering the adjustment step size for the next following iteration. When the changing condition is satisfied, the processing device can use a different/smaller step size for the next following iteration. At block 414, the processing device can verify whether the currently utilized step is the last step size within the accessible set of steps. If it is the last/smallest step size, the processing device can verify whether the currently tested page is the last page corresponding to a last iteration. If so, the method 400 can end or proceed to block 402 for the continuous calibration process. If it is not the end of the outer iteration, the processing device can return to block 402, and the processing device can select a different grouping of the memory cells 122.

At block 416, when the currently utilized step is not the last/smallest step size, the processing device can load a different/smaller step size for the next iteration. For example, the processing device can load the second step size, and change from using the first step size 186, when the change condition has been satisfied.

Also, for sets with more than two step sizes, the processing device can reset the change condition (e.g., the dither status 440) after loading the next smaller step size. Accordingly, the processing device can proceed iteratively as discussed above until the change condition is satisfied again.

Upon satisfying the change condition again, the processing device can load the next smaller step size and continue.

At block 418, the processing device can generate the updated read level 306 of FIG. 3 and calibrate the read level setting. The processing device can generate the updated read level 306 according to the step size appropriate for the condition/dither. For example, the processing device can generate the updated read level 306 by applying the appropriate step size (e.g., the first step size 186, the second step size 188, etc.) to the tested read level 302 along the update direction 304. The processing device can apply the first step size 186 when the change condition is not met, such as when the dither status is not determined (e.g., when the update direction 304 of the current iteration matches the previous direction 430). The processing device 6 can apply the second step size 188 (e.g., a smaller step size) when the change condition is met, such as when the dither status is determined (e.g., when the update direction 304 of the current iteration does not match the previous direction 430). In some embodiments, the processing device can iteratively apply the smaller step size (e.g., the second step size 188) that represents a value corresponding to a lowest significant bit (e.g., 1 click) of a level register.

The processing device can use the updated read level 306 as the tested read level 302 in the next subsequent iteration. In some embodiments, the processing device can store the updated read level 306 in the level register 164 and overwrite the read level setting. Afterwards, the processing device can perform method 400 for the next subsequent iteration. As a result, the processing device can access the updated read level 306 from the previous iteration as the tested read level 302 of the current iteration. In some embodiments, the processing device can temporarily store the updated read level 306 separate from the tested read level 302 and/or pass the updated read level 306 as the tested read level 302 for the next iteration. Afterwards, the next iteration can begin by calculating the offset levels based on the updated read level 306 of the previous iteration.

Accordingly, the memory system 102 (e.g., the controller 106) can iteratively calibrate the tested read level 302 using the first step size 186 until determining the changing condition (e.g., the dither status 440). After switching, the memory system 102 can iteratively calibrate the tested read level 302 using the second step size 188 after determining the changing condition. In some embodiments, the memory system 102 can calibrate the read level setting using additional step sizes. In utilizing multiple step sizes, the memory system 102 can reset a status/value tracking the changing condition, such as the dither status 440, after switching step sizes. Accordingly, the memory system 102 can iteratively calibrate the read level setting using the next step size until the changing condition is redetected. As a result of resetting the changing condition, the memory system 102 can iteratively change the step sizes. In some embodiments, the memory system 102 can iteratively reducing the step sizes, such as by sequentially using smaller step sizes.

Initially using larger step sizes (e.g., the first step size 186) and then switching to smaller step sizes (e.g., the second step size 188) based on determining the changing condition (e.g., the dither status 440) provides faster rate of convergence. Based on the larger step sizes, the memory system 102 can approach an estimated optimal read level (e.g., a center/minimum point of the error/read level correspondence plot as illustrated in FIGS. 2A-2C and FIGS. 3A-3C) in a shorter amount of time than using smaller step sizes. Based on switching to the smaller step size, the memory system 102 can use smaller granularity to recapture or preserve the accuracy in estimating the optimal read level that minimizes the error rate.

Figure 5:
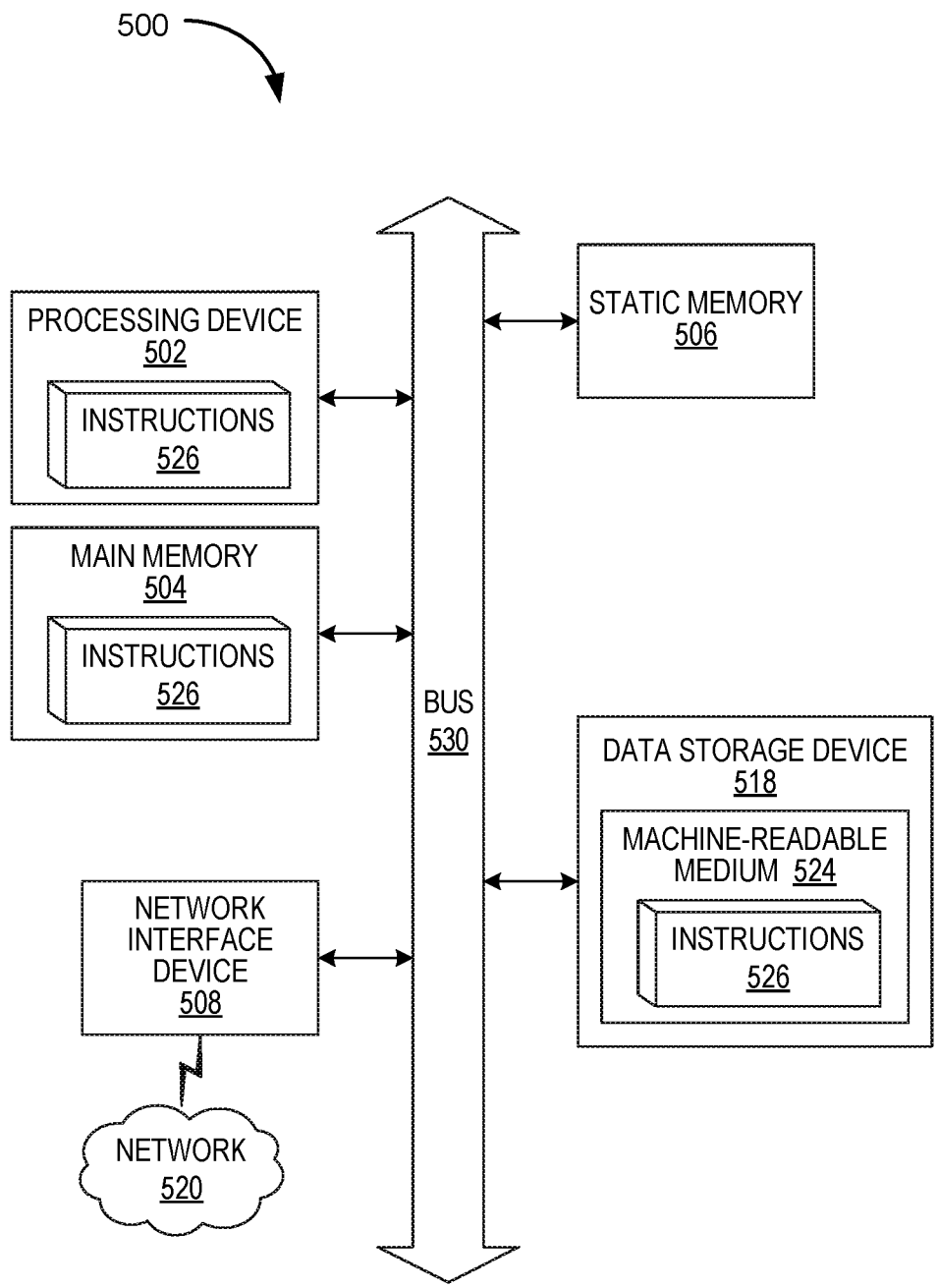
FIG. 5 is a block diagram of an example computer system in which embodiments of the present disclosure can operate.

FIG. 5 illustrates an example machine of a computer system 500 within which a set of instructions, for causing the machine to perform any one or more of the methodologies discussed herein, can be executed. In some implementations, the computer system 500 can correspond to a host system (e.g., the host 108 of FIG. 1) that includes or utilizes a memory system (e.g., the memory system 102 of FIG. 1) or can be used to perform the operations of a controller (e.g., to execute an operating system to perform operations corresponding to the convergence mechanism 130 of FIG. 1). In alternative implementations, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine may be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 500 includes a processing device 502, a main memory 504 (e.g., read-only memory (ROM), flash memory, dynamic random access memory (DRAM) such as synchronous DRAM (SDRAM) or Rambus DRAM (RDRAM), etc.), a static memory 506 (e.g., flash memory, static random access memory (SRAM), etc.), and a data storage system 518, which communicate with each other via a bus 530.

Processing device 502 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 502 can also be one or more special-purpose processing devices such as an application specific integrated circuit (ASIC), a field programmable gate array (FPGA), a digital signal processor (DSP), network processor, or the like. The processing device 502 is configured to execute instructions 526 for performing the operations and steps discussed herein. The computer system 500 can further include a network interface device 508 to communicate over the network 520.

The data storage system 518 can include a machine-readable storage medium 524 (also known as a computer-readable medium) on which is stored one or more sets of instructions or software 526 embodying any one or more of the methodologies or functions described herein. The instructions 526 can also reside, completely or at least partially, within the main memory 504 and/or within the processing device 502 during execution thereof by the computer system 500, the main memory 504 and the processing device 502 also constituting machine-readable storage media. The machine-readable storage medium 524, data storage system 518, and/or main memory 504 can correspond to the memory system 102 of FIG. 1.

In one implementation, the instructions 526 include instructions to implement functionality corresponding to a convergence mechanism (e.g., the convergence mechanism 130 of FIG. 1). While the machine-readable storage medium 524 is shown in an example implementation to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some implementations, a machine-readable (e.g., computer-readable) medium includes a machine (e.g., a computer) readable storage medium such as a read only memory ("ROM"), random access memory ("RAM"), magnetic disk storage media, optical storage media, flash memory devices, etc.

In the foregoing specification, implementations of the disclosure have been described with reference to specific example implementations thereof. It will be evident that various modifications can be made thereto without departing from the broader spirit and scope of implementations of the disclosure as set forth in the following claims. The specification and drawings are, accordingly, to be regarded in an illustrative sense rather than a restrictive sense.

We claim:

1. A system, comprising:
a memory device comprising a plurality of memory cells; and
a processing device coupled to the memory device, the processing device configured to:
iteratively update a center read level according to a first step size after reading a subset of memory cells according to a set of read levels including the center read level;
track an update direction for the processing device to use when iteratively updating the center read level, wherein the update direction corresponds to an increase or a decrease in the center read level;
detect a change condition based on updating the center read level according to the first step size; and
iteratively update the center read level according to a second step size based on detection of the change condition.

2. The system of claim 1, wherein the first step size is larger than the second step size.

3. The system of claim 2, wherein the second step size is a value corresponding to a lowest significant bit of a level register.

4. The system of claim 1, wherein the processing device is configured to:
store the update direction as a previous direction of a previous iteration;
detect the change condition based on comparing the previous direction to the update direction of a current iteration; and
update the center read level based on applying the second step after the update direction of the current iteration does not match the previous direction.

5. The system of claim 1, wherein the processing device is configured to:
store the update direction as a previous direction of a previous iteration;
detect the change condition based on comparing the previous direction to the update direction of a current iteration; and update the center read level based on applying the first step while the update direction of the current iteration matches the previous direction.

6. The system of claim 5, wherein the processing device is configured to:
determine a dither status when the update direction of the current iteration does not match the previous direction;
iteratively calibrate the center read level using the first step until determining the dither status; and
calibrate the center read level using the second step after determining the direction change status.

7. The system of claim 6, wherein the processing device is further configured to:
reset the direction change status after switching from the first step to the second step;
re-detect the change condition the direction change status based on updating the center read level according to the second step size; and
iteratively updating the center read level according to a third step size after re-detecting the direction change status, wherein the third step is smaller than the second step.

8. The system of claim 1, wherein the processing device is configured to determine the set of read results based on:
determining a center result based on reading with a center read level;
determining an upper result based on reading with an upper read level, wherein the upper read level is greater than the center read level; and
determining a lower result based on reading with a lower read level, wherein the lower read level is less than the center read level.

9. The system of claim 8, wherein the processing device is configured to determine the update direction based on:
calculating error measures corresponding to the center result, the upper result, and the lower result; and
determining the update direction as an increase direction when the error measure for the upper read level is less than the error measures for the center read level, the lower read level, or both.

10. The system of claim 1, wherein the plurality of memory cells are non-volatile storage devices arranged in a plurality of memory pages, and wherein the subset comprises one of the plurality of memory pages.

11. A method of operating a system including a memory circuitry, the method comprising:
iteratively updating a center read level according to a first step size after reading a subset of memory cells according to a set of read levels including the center read level;
tracking an update direction for the processing device to use when iteratively updating the center read level, wherein the update direction corresponds to an increase or a decrease in the center read level;
detecting a change condition based on updating the center read level according to the first step size; and
iteratively updating the center read level according to a second step size based on detection of the change condition.

12. The method of claim 11, wherein the first step size is larger than the second step.

13. The method of claim 12, wherein the second step size is one click.

14. The method of claim 11, further comprising:
storing the update direction as a previous direction of a previous iteration;
wherein detecting the change condition includes:
comparing the previous direction determined at the previous iteration with the update direction of a current iteration; and
detecting the change condition when the previous direction does not match the update direction of the current iteration.

15. The method of claim 14, wherein:
determining that the previous direction does not match the update direction of the current iteration includes determining a dither status;
the center read level is iteratively updated using the first step before determining the direction change status; and
the center read level is iteratively updated using the second step after determining the direction change status.

16. The method of claim 15, further comprising:
resetting the dither status after switching from the first step to the second step;
re-detecting the dither status based on updating the center read level according to the second step size; and
iteratively updating the center read level according to a third step after re-detecting the dither status, wherein the third step is smaller than the second step.

17. The method of claim 11, further comprising:
reading the subset of memory cells according to the set of read levels, wherein reading the subset of memory cells includes:
determining a center result based on reading with the center read level;
determining an upper result based on reading with an upper read level, wherein the upper read level is greater than the center read level; and
determining a lower result based on reading with a lower read level, wherein the lower read level is less than the center read level.

18. The method of claim 17, wherein tracking the update direction includes:
calculating error measures corresponding to the center result, the upper result, and the lower result; and
determining the update direction as an increase direction when the error measure for the upper read level is less than the error measures for the center read level, the lower read level, or both.

19. A system, comprising:
a memory device comprising non-volatile memory cells arranged in memory pages; and
a processing device coupled to the memory device, the processing device configured to calibrate a center read level using n number of sequenced step sizes based on:
iteratively calibrating the center read level using a step size;
tracking an update direction for the iterative updates, wherein the update direction represents an increase or a decrease in the center read level across iterations;
detecting a dither status when the update direction changes between iterations;
loading a next step size based on the dither status; and
repeating the iterative calibration, tracking of the update direction, detection of the dither status, and loading of the next step size until the center read level is calibrated using n-th step size.

20. The system of claim 19, wherein the processing device is configured to:
iteratively calculate the center read level based on:
determining a set of read levels including:
a lower read level less than the center read level, and an upper read level greater than the center read level;
determining a set of error measures corresponding to read results associated with reading a memory page according to the set of read levels; and
determine the update direction as the direction corresponding to the lower read level or the upper read level having comparatively smaller error measure for reaching a lowest error measure in the set of error measures.

\* \* \* \* \*